United States Patent
Lee

(10) Patent No.: US 12,392,842 B2
(45) Date of Patent: Aug. 19, 2025

(54) BATTERY REPLACEMENT DEVICE, BATTERY STATE DIAGNOSIS SERVER DEVICE AND METHOD, AND BATTERY REPLACEMENT SYSTEM COMPRISING SAME

(71) Applicant: LG Energy Solution, Ltd., Seoul (KR)

(72) Inventor: Keunwook Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/039,557

(22) PCT Filed: Jul. 18, 2022

(86) PCT No.: PCT/KR2022/010421
§ 371 (c)(1),
(2) Date: May 31, 2023

(87) PCT Pub. No.: WO2023/038275
PCT Pub. Date: Mar. 16, 2023

(65) Prior Publication Data
US 2023/0417837 A1    Dec. 28, 2023

(30) Foreign Application Priority Data

Sep. 8, 2021    (KR) ........................ 10-2021-0119789

(51) Int. Cl.
*G01R 31/392*    (2019.01)
*G01R 31/3842*    (2019.01)
(Continued)

(52) U.S. Cl.
CPC ....... *G01R 31/392* (2019.01); *G01R 31/3842* (2019.01); *G01R 31/389* (2019.01);
(Continued)

(58) Field of Classification Search
None
See application file for complete search history.

(56) References Cited

U.S. PATENT DOCUMENTS

| | | |
|---|---|---|
| 6,842,708 B2 | 1/2005 | Odaohhara |
| 7,062,390 B2 | 6/2006 | Kim et al. |
| (Continued) | | |

FOREIGN PATENT DOCUMENTS

| | | |
|---|---|---|
| CN | 102183730 A | 9/2011 |
| CN | 111896880 A | 11/2020 |
| (Continued) | | |

OTHER PUBLICATIONS

International Search Report for PCT/KR2022/010421 mailed Nov. 8, 2022. 3 pgs.

(Continued)

*Primary Examiner* — Jas A Sanghera
(74) *Attorney, Agent, or Firm* — Lerner David LLP

(57) ABSTRACT

A battery swapping apparatus, an apparatus for diagnosing a battery condition, a method for diagnosing a battery condition, and a battery exchange system including the battery swapping apparatus and the apparatus for diagnosing a battery condition with high-efficiency and high-reliability are disclosed. The battery exchange system may discharge a battery pack in which charging has been stopped, calculate at least one state information of the discharged battery pack, resume charging of the battery pack, calculate the impedance information from the at least one state information of the discharged battery pack, and determine a state of health (SoH) of the battery pack and whether the battery pack is defective.

18 Claims, 5 Drawing Sheets

(51) Int. Cl.
*G01R 31/389* (2019.01)
*H02J 7/00* (2006.01)

(52) U.S. Cl.
CPC ............ *H02J 7/0048* (2020.01); *H02J 7/005* (2020.01); *H02J 7/007182* (2020.01)

(56) References Cited

U.S. PATENT DOCUMENTS

| | | | |
|---|---|---|---|
| 9,207,286 B2 | 12/2015 | Matsui et al. | |
| 9,506,987 B2* | 11/2016 | Mattisson | H01M 10/48 |
| 9,627,920 B2 | 4/2017 | Yun | |
| 10,719,867 B2 | 7/2020 | Uchida | |
| 2008/0204031 A1* | 8/2008 | Iwane | G01R 31/389 |
| | | | 324/430 |
| 2010/0289447 A1* | 11/2010 | Dobson | H02J 7/00 |
| | | | 320/101 |
| 2011/0077879 A1* | 3/2011 | Paryani | H02J 7/0071 |
| | | | 320/162 |
| 2013/0043841 A1 | 2/2013 | Wei | |
| 2014/0091751 A1* | 4/2014 | Workman | H02J 7/0016 |
| | | | 320/126 |
| 2015/0181942 A1 | 7/2015 | Holzherr et al. | |
| 2015/0377976 A1 | 12/2015 | Maluf et al. | |
| 2016/0069963 A1 | 3/2016 | Hebiguchi | |
| 2016/0187432 A1* | 6/2016 | Saint-Marcoux | B60L 3/0046 |
| | | | 702/63 |
| 2016/0226269 A1 | 8/2016 | Hwang et al. | |
| 2018/0149709 A1 | 5/2018 | Jo | |
| 2019/0178943 A1* | 6/2019 | Lih | G01R 31/3842 |
| 2019/0207267 A1 | 7/2019 | Vickery et al. | |
| 2020/0072909 A1 | 3/2020 | Soejima et al. | |
| 2020/0124673 A1 | 4/2020 | Heo | |
| 2021/0031645 A1 | 2/2021 | Reeves | |
| 2021/0063490 A1 | 3/2021 | Naha et al. | |
| 2021/0080505 A1* | 3/2021 | Delaille | G01R 31/3646 |
| 2021/0248535 A1 | 8/2021 | Ikui | |
| 2022/0381845 A1* | 12/2022 | Yagi | G01R 31/3648 |
| 2023/0009288 A1* | 1/2023 | Kang | B60L 3/0046 |

FOREIGN PATENT DOCUMENTS

| | | |
|---|---|---|
| JP | 2002330547 A | 11/2002 |
| JP | 4570991 B2 | 10/2010 |
| JP | 201515827 A | 1/2015 |
| JP | 2015534458 A | 12/2015 |
| JP | WO2016147722 A1 | 12/2017 |
| JP | 2020034426 A | 3/2020 |
| JP | 202078179 A | 5/2020 |
| KR | 101417105 B1 | 7/2014 |
| KR | 20180049543 A | 5/2018 |
| KR | 20180060622 A | 6/2018 |
| KR | 20200017367 A | 2/2020 |
| KR | 20200020566 A | 2/2020 |
| KR | 20200090724 A | 7/2020 |
| KR | 20200116575 A | 10/2020 |
| KR | 102255523 B1 | 5/2021 |
| KR | 20210077948 A | 6/2021 |
| WO | 2020127091 A1 | 6/2020 |
| WO | 2021040146 A1 | 3/2021 |

OTHER PUBLICATIONS

Extended European Search Report including Written Opinion for Application No. 22867544.3 dated Apr. 23, 2024, pp. 1-9.

* cited by examiner

[Figure 1]
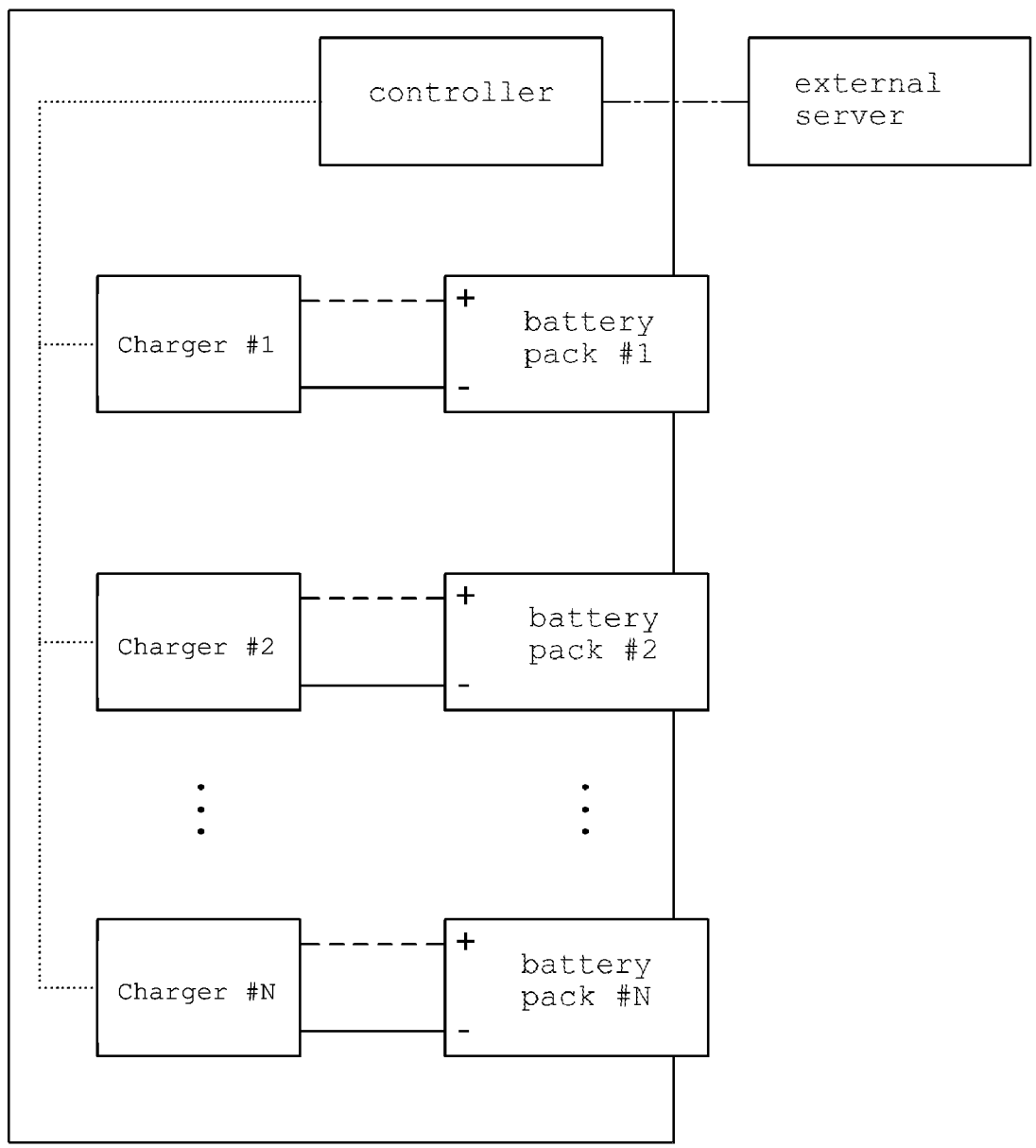

[Figure 2]
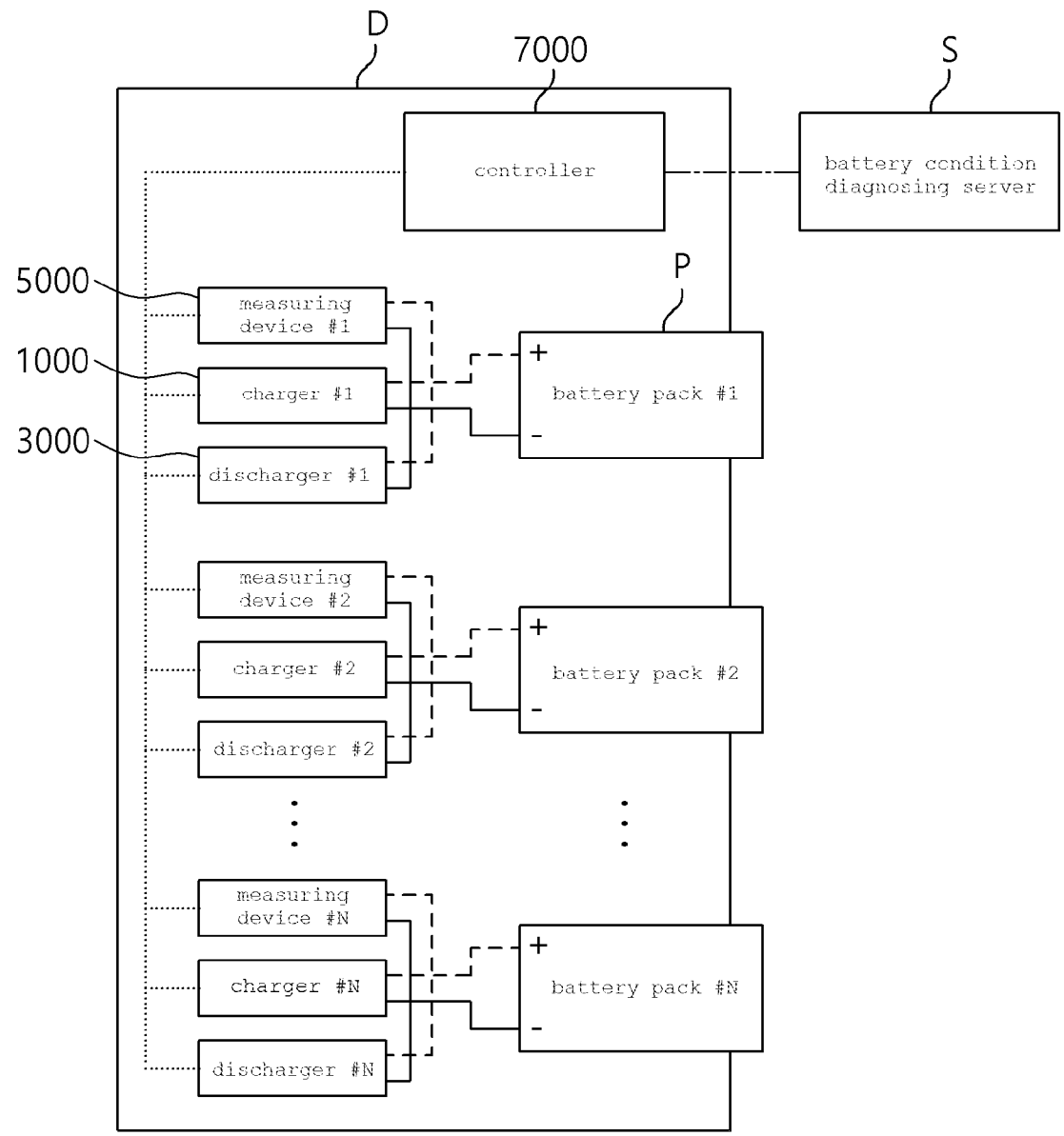

[Figure 3]
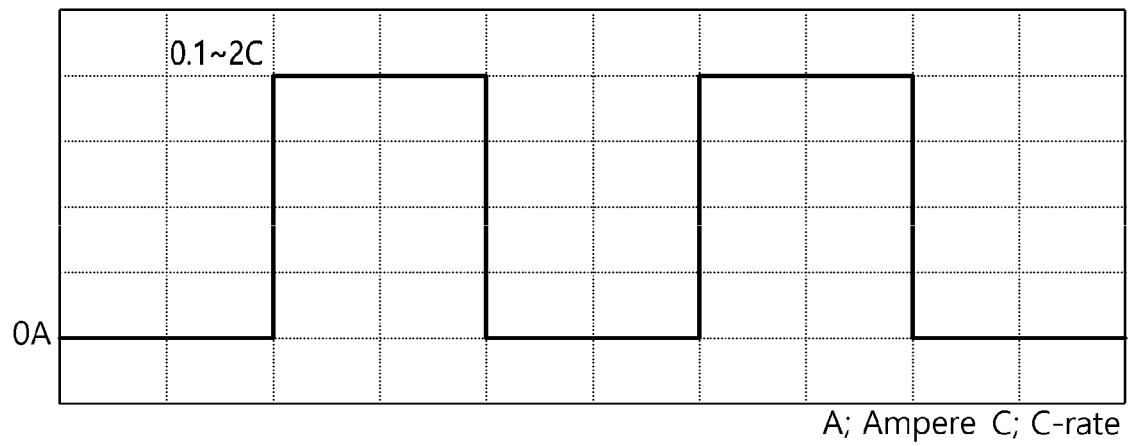

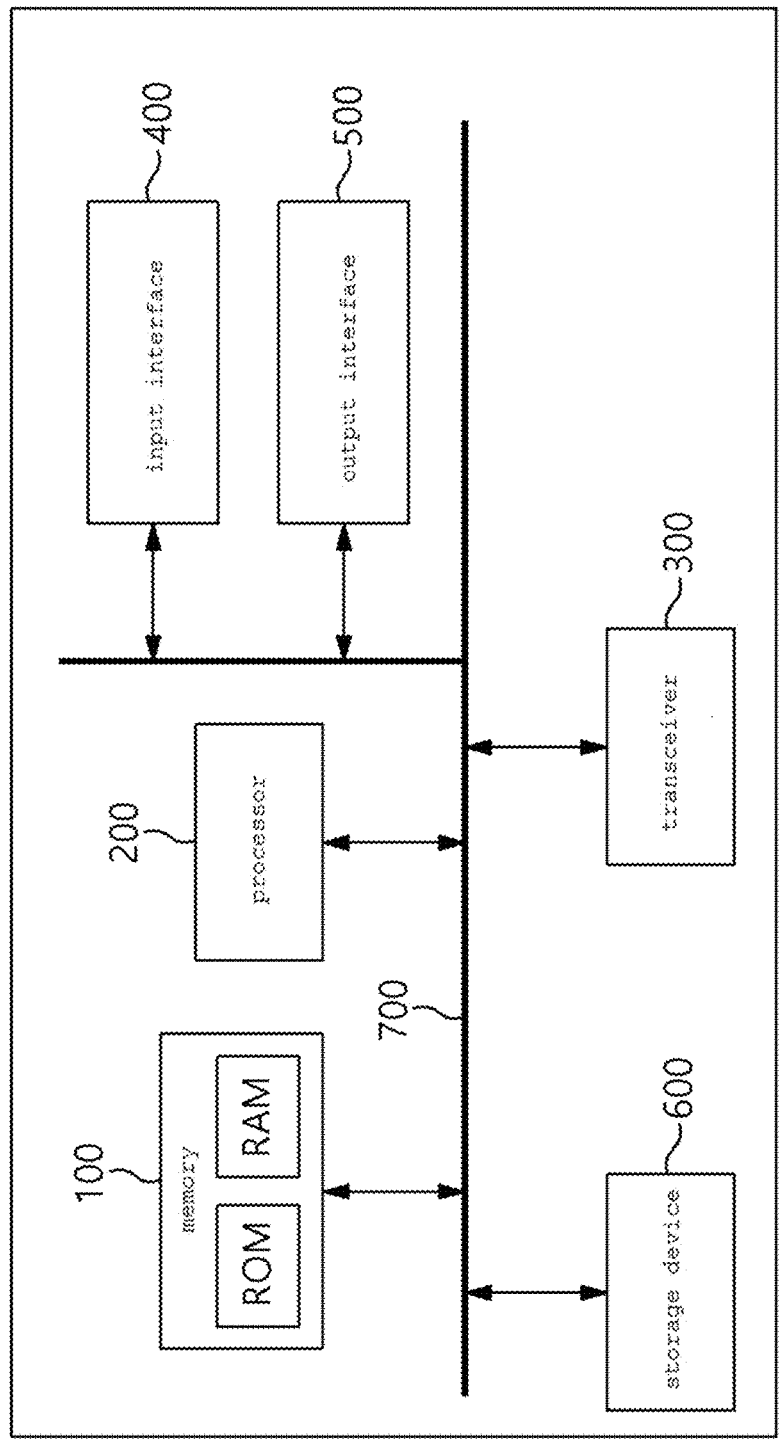
[Figure 4]

[Figure 5]
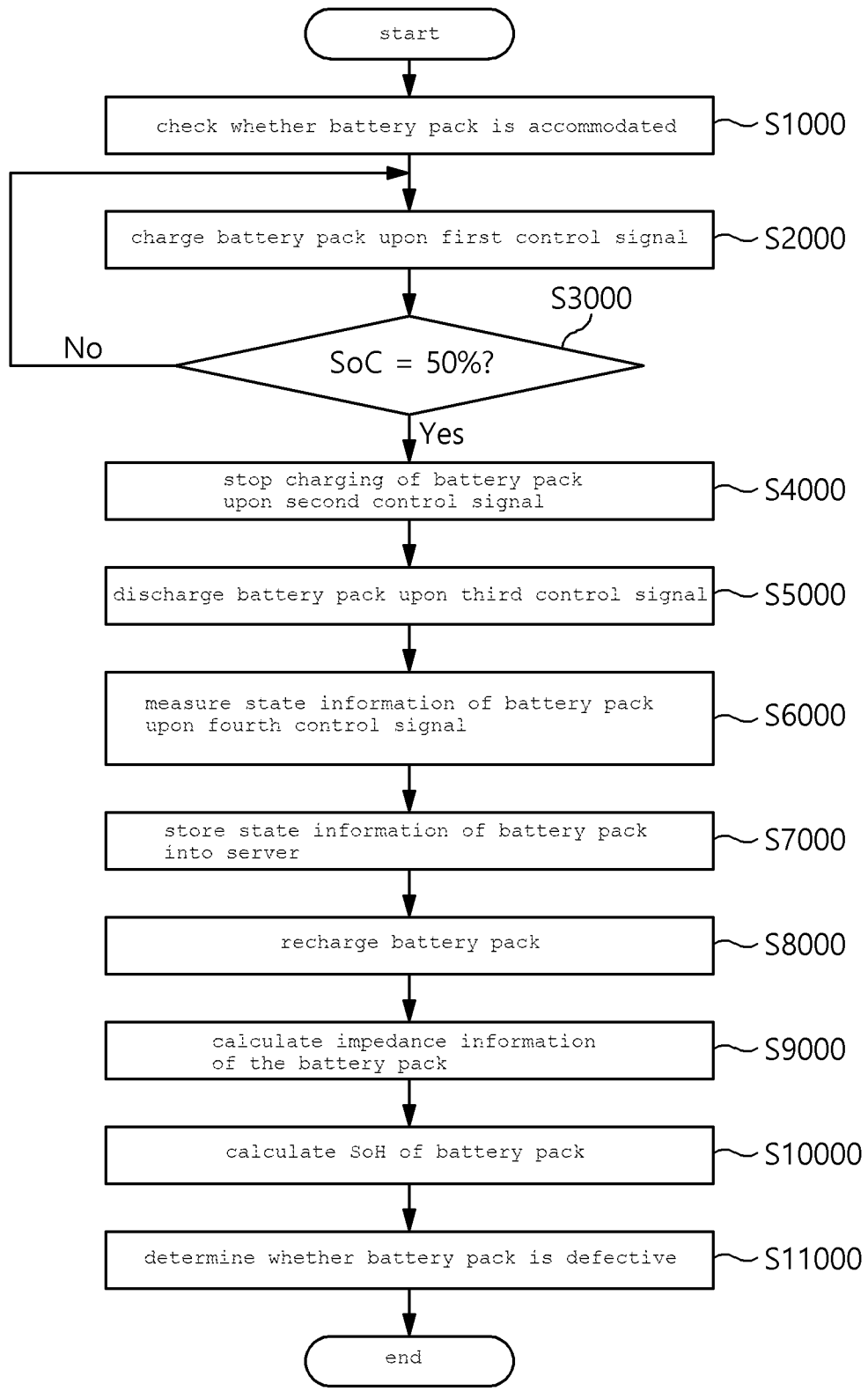

BATTERY REPLACEMENT DEVICE, BATTERY STATE DIAGNOSIS SERVER DEVICE AND METHOD, AND BATTERY REPLACEMENT SYSTEM COMPRISING SAME

CROSS-REFERENCE TO RELATED APPLICATIONS

The present application is a national phase entry under 35 U.S.C. § 371 of International Application No. PCT/KR2022/010421 filed Jul. 18, 2022, which claims priority from Korean Patent Application No. 10-2021-0119789 filed Sep. 8, 2021, all of which are incorporated herein by reference.

TECHNICAL FIELD

The present invention relates to a battery swapping apparatus, an apparatus for diagnosing battery condition, a system including the same, and a method for diagnosing battery condition, and more particularly, to a battery swapping apparatus, an apparatus for diagnosing battery condition, a system including the same, and a method for diagnosing battery condition by measuring impedance of a battery pack in real time along with charging the battery pack to determine a state of health and a defect of a battery pack.

BACKGROUND ART

Conventionally, a voltage, a current, and a temperature of a battery pack are separately measured in order to estimate a state of health of the battery pack. However, the conventional method for measuring a state of health of a battery pack has a disadvantage in that an error range of measurement result is large, and thus a capacity of a battery pack is excessively estimated. Accordingly, a problem occurs in that a battery life is shortened compared to the estimated capacity of the battery.

In addition, a conventional apparatus for estimating a state of health of a battery pack makes it difficult to detect a fire or an explosion in advance because it is difficult to diagnose internal defects in a battery cell, an appliance or an electronic device including the battery cell.

Accordingly, recently, a method of measuring impedance of a battery has been provided in order to accurately estimate a state of health of a battery pack and diagnose defects.

However, it is difficult to diagnose a battery pack defect occurring during use of the battery pack since it is difficult to measure impedance of the battery pack in real time with an existing impedance measurement method.

SUMMARY

Technical Problem

Accordingly, example embodiments of the present disclosure are provided to substantially obviate one or more problems due to limitations and disadvantages of the related art.

Embodiments of the present disclosure provide a battery swapping apparatus with high efficiency and high reliability, wherein the battery swapping apparatus is configured to measure state information of a battery pack.

Embodiments of the present disclosure also provide a battery diagnosing server with high efficiency and high reliability, wherein the battery diagnosing server is configured to calculate impedance from state information of the battery pack and determines a state of health (SoH) of the battery pack and whether the battery pack is defective.

Embodiments of the present disclosure also provide a method for diagnosing a condition of a battery pack with high efficiency and high reliability, wherein the battery exchange method calculates impedance from state information of the battery pack and determines a state of health (SoH) of the battery pack and whether the battery pack is defective.

Embodiments of the present disclosure also provide a battery exchange system with high efficiency and high reliability, wherein the battery exchange system is configured to calculate impedance from state information of the battery pack and determines a state of health (SoH) of the battery pack and whether the battery pack is defective.

Technical Solution

In order to achieve the objective of the present disclosure, a battery swapping apparatus may comprise: a charger configured to charge a battery pack accommodated within the battery swapping apparatus; a discharger configured to discharge the battery pack; a sensor configured to measure state information of the battery pack; and a controller configured to, in response a state of charge of the battery pack reaching a predetermined reference value: stop operation of the charger; control the discharger to operate; and acquire the state information of the battery pack in a discharged state.

The controller may be configured to, upon acquisition of the state information of the battery pack in the discharged state, control the charger to resume charging until the battery pack is fully charged.

The controller may be communicatively connected to an external server and the controller is configured to transmit the state information of the battery pack to the external server.

The state information of the battery pack may include at least one of a voltage, a current or a temperature of the battery pack.

The discharger may be configured to discharge the battery pack by outputting a pulse type discharge current.

According to another embodiment of the present disclosure, an apparatus for diagnosing a condition of a battery pack, may comprise: at least one processor; and a memory having stored thereon at least one instruction executed by the at least one processor, wherein the at least one instruction causes the at least one processor to: receive and store state information of the battery pack; calculate impedance information based on the received state information of the battery pack; and calculate a state of health (SoH) of the battery pack from the impedance information.

The state information of the battery pack may be indicative of a condition of the battery pack upon being charged to a predetermined reference value and subsequently discharged.

The state information of the battery pack may include at least one of a voltage, a current or a temperature of the battery pack.

The at least one instruction may cause the at least one processor to: calculate a change in internal resistance of the battery pack from the state information of the battery pack; and calculate the SoH of the battery pack based further on the calculated change in internal resistance of the battery pack.

Here, the at least one instruction may cause the at least one processor to determine whether to diagnose a defect of the battery pack based on the SoH of the battery pack.

The at least one instruction instruction may cause the at least one processor to: compare the SoH of the battery pack with a reference SoH; and determine presence of a defect in the battery pack in response to a difference between the SoH of the battery pack and the reference SoH exceeding a threshold value.

According to another embodiment of the present disclosure, a method for diagnosing a condition of a battery pack may comprise: receiving and storing, by at least one processor, state information of the battery pack; calculating, by the at least one processor, impedance information based on the state information of the battery pack; and calculating, by the at least one processor, a state of health (SoH) of the battery pack from the impedance information.

The at least one state information of the battery pack may be indicative of a condition of the battery pack upon being charged to a predetermined reference value and subsequently discharged.

The state information of the battery pack may include at least one of a voltage, a current or a temperature of the battery pack.

Calculating the state of health (SoH) of the battery pack may include: calculating a change in internal resistance of the battery pack from the state information of the battery pack; and calculating the SoH of the battery pack based on the calculated change in the internal resistance of the battery pack.

The method may further comprise determining, by the at least one processor, whether to diagnose a defect of the battery pack based on the SoH of the battery pack.

Determining whether to diagnose a defect of the battery pack may include: comparing the SoH of the battery pack with a reference SoH; and determining presence of a defect in the battery pack in response to a difference between the SoH of the battery pack and the reference SoH exceeding a threshold value.

According to another embodiment of the present disclosure, a battery exchange system may comprise: a battery swapping apparatus according to any of the embodiments described herein; and a server communicatively connected to the battery swapping apparatus, wherein the controller of the battery swapping apparatus is configured to transmit the state information of the battery pack to the server, and wherein the server is configured to calculate an impedance of the battery pack based on the state information transmitted by the battery swapping apparatus.

The battery swapping apparatus may be configured to stop charging of the battery in response to a state of charge (SoC) of the battery pack reaching a predetermined reference value.

The server may be configured to determine whether the battery pack is defective based the calculated impedance of the battery pack.

Advantageous Effects

A battery swapping apparatus, an apparatus (server) for diagnosing a battery condition, a method for diagnosing a battery condition, and a battery exchange system including the battery swapping apparatus and the apparatus for diagnosing a battery condition, according to the embodiments of the present invention, may discharge a battery pack in which charging has been stopped, calculate at least one state information of the discharged battery pack, resume charging of the battery pack, calculate the impedance information from the at least one state information of the discharged battery pack, and determine a state of health (SoH) of the battery pack and whether the battery pack is defective, with high-efficiency and high-reliability.

BRIEF DESCRIPTION OF THE DRAWINGS

Example embodiments of the present invention will become more apparent by describing in detail example embodiments of the present invention with reference to the accompanying drawings, in which:

FIG. 1 is a block diagram of a conventional battery exchange system.

FIG. 2 is a block diagram of a battery exchange system according to embodiments of the present invention.

FIG. 3 is a graph showing a pulse signal waveform of a discharge current of a battery pack according to embodiments of the present invention.

FIG. 4 is a block diagram of a battery condition diagnosing server according to embodiments of the present invention.

FIG. 5 is a flowchart illustrating a method of diagnosing a battery condition using a battery exchange system according to embodiments of the present invention.

DETAILED DESCRIPTION

Example embodiments of the present invention are disclosed herein. However, specific structural and functional details disclosed herein are merely representative for purposes of describing example embodiments of the present invention, and example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, exemplary embodiments of the present invention will be described in detail with reference to the accompanying drawings.

FIG. 1 shows a block diagram of a conventional battery exchange system.

Referring to FIG. 1, a conventional battery exchange system is provided with a battery swapping apparatus in which a charger is individually connected to a battery accommodating part in which a battery pack is accommodated and an external server for storing a charge amount of the battery pack.

Accordingly, the conventional battery exchange system simply provides only a charging function of a battery pack, and thus cannot take into account a change in impedance of the battery pack, a state of health of the battery pack and presence or absence of defects. Therefore, the conventional battery exchange system shows a low reliability.

On the other hand, a battery exchange system according to embodiments of the present invention may measure state information along with charging of a battery pack, calculate impedance of the battery pack from the measured state information, determine a state of health using the calculated impedance, and determine presence or absence of defects of the battery pack, thereby providing a high-efficiency and high-reliability battery exchange system.

A battery exchange system according to embodiments of the present invention will be described in more detail with reference to the following drawings.

FIG. 2 is a block diagram of a battery exchange system according to embodiments of the present invention.

Referring to FIG. 2, the battery exchange system according to embodiments of the present invention may include a battery swapping apparatus (D) and an external battery condition diagnosing server (S). Here, the battery swapping apparatus may be referred to as a battery swapping station.

More specifically, the battery swapping apparatus (D) may be connected with an external battery condition diagnosing server(S) through external communication. Accordingly, the battery exchange system may control charging of the battery packs (P) accommodated in a battery accommodating part by the battery swapping apparatus (D) and measure at least one state information of the battery packs (P). The external battery condition diagnosing server (S) may determine and provide impedance information, a state of health (SoH), and defects of the battery packs P based on the measured state information of at least one of the battery packs P.

As to more specifics of the components (D, S) of the battery exchange system according to embodiments of the present invention, the battery swapping apparatus (D) may include at least one battery accommodating part.

The battery accommodating part may accommodate the battery packs P inserted from outside by a user. Accordingly, the battery swapping apparatus D may charge at least one battery pack P accommodated in the battery accommodating part and diagnose whether the battery pack P being charged is defective in real time.

Furthermore, the battery swapping apparatus D may provide a user with a battery pack P that has been fully charged among the battery packs P accommodated in the at least one battery accommodating part.

The battery swapping apparatus D may include a charger 1000, a discharger 3000, a measuring device 5000, and a controller 7000.

Here, the charger 1000, the discharger 3000, and the measuring device 5000 may be connected in parallel, and the charger 1000, the discharger 3000, and the measuring device 5000 may be connected to the controller 7000 through internal communication, respectively. According to embodiments, the internal communication may be provided by any one of Universal Asynchronous Receiver/Transmitter (UART), Controller Area Network (CAN), Local Interconnect Network (LIN), and Ethernet.

At least one charger 1000 may be provided in the battery swapping apparatus D to charge at least one battery pack P accommodated in the battery accommodating parts. Here, the battery pack P is a device for storing energy and may be applied to at least one electric device to provide power to the electric device. For example, the at least one electric device may be any one of an electric scooter, a kickboard, a car, a robot, or a drone.

According to an embodiment, when at least one battery pack P is accommodated in battery accommodating parts, at least one charger 1000 may be individually connected to the at least one battery pack P. In other words, chargers 1000 may be 1 to 1 connected to battery packs P.

For example, to be more specific, when N battery packs P and N chargers 1000 are provided, the (+) terminal and the (−) terminal of the first charger 1000 are connected to the (+) terminal and the (−) terminal of the battery accommodating part in which the first battery pack $P_1$ is accommodated. In addition, the (+) terminal and the (−) terminal of the Nth charger 1000 are connected to the (+) terminal and the (−) terminal of the battery accommodating part in which the Nth battery pack $P_N$ is accommodated.

When the charger 1000 receives a first control signal from a controller 7000, which will be described later, the charger may convert AC power provided to the battery swapping apparatus D to DC power and charge a specific battery pack P that is individually connected to the charger.

Furthermore, upon receiving a second control signal from the controller 7000, which will be described later, the charger 1000 may stop charging the specific battery pack P being charged. According to an embodiment, the controller 7000 may transmit a second control signal to the charger 1000 when a charge amount of the battery pack P being charged satisfies a specific reference value. Accordingly, the charger 1000 may stop charging the battery pack P being charged. For example, the second control signal may be transmitted when a state of charge of the battery pack P reaches 50% or more.

At least one discharger 3000 may be provided in the battery swapping apparatus D to discharge at least one battery pack P accommodated in the battery accommodating parts.

To be more specific, when at least one battery pack P is accommodated in battery accommodating parts, at least one discharger 3000 may be individually connected to at least one battery packs P. In other words, dischargers 3000 may be 1 to 1 connected to battery packs P.

For example, to be more specific, when N battery packs P and N dischargers 3000 are provided, the (+) terminal and the (−) terminal of the first discharger 3000 are connected to the (+) terminal and the (−) terminal of the battery accommodating part in which the first battery pack $P_1$ is accommodated. In addition, the (+) terminal and the (−) terminal of the Nth discharger 3000 are connected to the (+) terminal and the (−) terminal of the battery accommodating part in which the Nth battery pack $P_N$ is accommodated.

When the discharger 3000 receives a third control signal from the controller 7000, which will be described later, the discharger 3000 may discharge a specific battery pack P which is individually connected to the discharger.

According to an embodiment, the discharger 3000 may receive a third control signal from the controller 7000. More specifically, the discharger 3000 may receive the third control signal from the controller 7000 after a state of charge of the battery pack P satisfies a specific reference value and charging is stopped.

The discharger 3000 may discharge the battery pack P upon receiving the third control signal from the controller 7000.

In this instance, the discharger 3000 may discharge the battery pack P using a discharge current to be output as a pulse signal waveform.

FIG. 3 is a graph showing a pulse signal waveform of a discharge current of a battery pack according to embodiments of the present invention.

Referring to FIG. 3, the discharger 3000 may adjust at least one parameter among an amplitude, a period, and a frequency of a discharge current so that the discharge current of a battery pack P has various pulse waveforms.

According to an exemplary embodiment, the discharger 3000 may discharge the battery pack P so that the discharge current is output in one cycle within 10 seconds at a 0.5 C-rate.

According to another exemplary embodiment, the discharger 3000 may discharge the battery pack P so that the discharge current is output in three cycles within 20 seconds at a 1 C-rate.

Here, the C-rate may be defined as an amount that can be discharged during a corresponding time when the battery pack is discharged at a specific constant current. For example, when using a battery pack having a charge capacity of 3000 mA/h, the discharger 3000 may output a maximum discharge current of 3000 mA at 1 C-rate.

However, the disclosure is not limited thereto, and the battery swapping apparatus D may output a charging current in a pulse type signal by controlling the charger 1000 instead of the discharger 3000.

Referring back to FIG. 1, the measuring device 5000 may measure at least one state information of the battery pack P upon receiving a fourth control signal from the controller 7000.

More specifically, according to an embodiment, when at least one battery pack P is accommodated in battery accommodating parts, the at least one measuring device 5000 may be individually connected to the at least one battery pack P. In other words, the measuring devices 5000 may be 1:1 connected to battery packs P.

For example, to be more specific, when N battery packs P and N measuring devices 5000 are provided, the (+) terminal and the (−) terminal of the first measuring device 5000 are connected to the (+) terminal and the (−) terminal of the battery accommodating part in which the first battery pack $P_1$ is accommodated. In addition, the (+) terminal and the (−) terminal of the Nth measuring devices 5000 are connected to the (+) terminal and the (−) terminal of the battery accommodating part in which the Nth battery pack $P_N$ is accommodated.

However, the measuring devices 5000 may be provided in a single device without being limited thereto. More specifically, one measuring device 5000 may be connected to at least one switch (not shown) connected to at least one battery pack P. Accordingly, the measuring device 5000 may measure the state information of at least one battery pack P connected 1 to 1 with the at least one switch according to On/Off operation of the at least one switch.

As described above, upon receiving a fourth control signal from the controller 7000, which will be described later, the measuring device 5000 may measure at least one state information of the specific battery pack P which is individually connected to the measuring device.

In more detail according to the embodiment, the measuring device 5000 may receive the fourth control signal from the controller 7000. Here, the fourth control signal may be transmitted after the third control signal is transmitted by the controller 7000. In other words, the measuring device 5000 may measure at least one state information of a specific battery pack P in a discharged state. For example, the at least one state information may include at least one of a voltage (V), a current (I), and a temperature (T).

Thereafter, the measuring device 5000 may transmit at least one measured state information to the controller 7000, to be described later.

As described above, the controller 7000 may be connected to the charger 1000, the discharger 3000, and the measuring device 5000 through internal communication, respectively. Accordingly, the controller 7000 may transmit operation control signals to the charger 1000, the discharger 3000, and the measuring device 5000, and may receive at least one measurement information from the charger 1000, the discharger 3000, and the measuring device 5000.

According to an embodiment, when a battery pack P is accommodated in at least one battery accommodating part, the controller 7000 may transmit a first control signal to the charger 1000 connected to a corresponding battery accommodating part. Here, the first control signal may be a control signal for starting an operation of the charger 1000.

According to another embodiment, when a state of charge (SoC) of the battery pack P reaches a specific reference value during the operation of the charger 1000 according to the first control signal, the controller 7000 may transmit a second control signal to the charger 1000. Here, the second control signal may be a control signal for stopping the operation of the charger 1000, and a specific reference value of state of charge (SoC) of a specific battery pack may be 50%.

In other words, when a state of charge (SoC) of a specific battery pack is 50% or more, the controller 7000 may transmit the second control signal to the charger 1000 to stop charging of the specific battery pack P.

Furthermore, after transmitting the second control signal to the charger 1000, the controller 7000 may transmit a third control signal to the discharger 3000 connected in parallel with the charger 1000.

Here, the third control signal is a signal for controlling operation of the discharger 3000. Upon receiving the third control signal, the discharger 3000 may output a pulse type discharge current to the battery pack P whose charging is stopped by the second control signal.

Thereafter, the controller 7000 may transmit a fourth control signal to the measuring device 5000 connected in parallel with the charger 1000 and the discharger 3000. In other words, the controller 7000 may operate the measuring device 5000 and receive at least one state information of the specific battery pack P measured by the measuring device 5000.

Furthermore, the controller 7000 may be connected to a battery condition diagnosing server S to be described later by an external communication. Here, the external communication may be at least one of wired/wireless communication such as Ethernet, 3G, 4G, and 5G.

The controller 7000 may be connected to the external battery condition diagnosing server S and transmit state information of the specific battery pack P received from the measuring device 5000 to the battery condition diagnosing server S. Thereafter, the controller 7000 may receive impedance information of the specific battery pack P calculated from the external battery condition diagnosing server S.

Here, the impedance information of the specific battery pack P may be calculated using the state information of the specific battery pack P by the external battery condition diagnosis server device S.

Thereafter, the controller 7000 may transmit a first control signal to the charger 1000 connected to the specific battery pack P. Accordingly, the charger 1000 may resume charging of the specific battery pack P in which charging has been stopped, thereby fully charging the specific battery pack P.

The battery condition diagnosing server S may be linked with the controller 7000 through external communication. Accordingly, the battery condition diagnosing server S may store at least one state information of the specific battery pack P received from the controller 7000. Here, the state information may include voltage (V), current (I), and temperature (T) information of the specific battery pack P, as described above.

The battery condition diagnosing server S may use the received state information of the specific battery pack P to diagnose a condition of the battery pack P in real time.

More specifically, the battery condition diagnosing server S may calculate impedance information of the specific battery pack P by using the state information of the specific battery pack P received by the controller 7000.

The battery condition diagnosing server S may store the calculated impedance information of the specific battery pack P and transmit the impedance information to the controller 7000.

The battery condition diagnosing server S may calculate a state of health (SoH) of the specific battery pack P based on impedance information of the battery pack P.

According to an embodiment, the battery condition diagnosing server S may calculate a change in internal resistance of the specific battery pack P according to a change in the impedance of the specific battery pack P.

Thereafter, the battery condition diagnosing server S may calculate the state of health of the specific battery pack P from the calculated change in internal resistance. For example, when the internal resistance increases, the lifespan of the specific battery pack P may be shortened, and thus the state of health (SoH) may be worse.

Also, the battery condition diagnosing server S may determine whether the battery pack of the specific battery pack P is defective based on the impedance information of the specific battery pack P.

More specifically, according to embodiments, the battery condition diagnosing server S may compare the SoH of the specific battery pack P with a SoH of a reference battery pack under the same conditions.

Here, when a difference of the SoH of the specific battery pack (P) and the reference SoH is more than a threshold value, the battery condition diagnosing server (S) may determine that a defect has occurred in the specific battery pack (P). Here, the defect may include a defect caused by a battery cell, an electric device or an appliance including the battery cell.

FIG. 4 is a block diagram of a battery condition diagnosing server according to embodiments of the present invention.

Referring to FIG. 4, the battery condition diagnosing server S may include a memory 100, a processor 200, a transceiver 300, an input interface 400, an output interface 500, and a storage device 600.

Each of the components 100, 200, 300, 400, 500, and 600 included in the battery condition diagnosing server S may be connected by a bus 700 to communicate with each other.

Among the components 100, 200, 300, 400, 500, and 600 of the battery condition diagnosing server S, the memory 100 and the storage device 600 may consist of at least one of a volatile storage medium and a non-volatile storage medium. For example, the memory 100 and the storage device 600 may include at least one of a read only memory (ROM) and a random access memory (RAM).

Among them, the memory 100 may include at least one instruction executed by the processor 200.

According to embodiments, the at least one instruction may include an instruction to receive and store at least one state information of the battery pack, an instruction to calculate impedance information from at least one state information of the battery pack, and an instruction to calculate a state of health (SoH) of the battery pack from the impedance information.

The processor 200 may mean a central processing unit (CPU), a graphics processing unit (GPU), or a dedicated processor on which methods according to embodiments of the present invention are performed.

As described above, the processor 200 may execute at least one program instruction stored in the memory 100.

In the above, a battery exchange system including a battery swapping apparatus and a battery condition diagnosing server according to embodiments of the present invention has been described. Hereinafter, a method of diagnosing a battery state using a battery exchange system will be described in more detail.

FIG. 5 is a flowchart illustrating a method of diagnosing a battery condition using a battery exchange system according to embodiments of the present invention.

Referring to FIG. 5, the battery exchange system may check whether a battery pack P in a discharged state is accommodated in the battery accommodating part (operation S1000).

In the instance that a battery pack P is accommodated in at least one battery accommodating part, the battery exchange system may operate the charger 1000 connected to the corresponding battery accommodating part by using a first control signal of the controller 7000 to charge the battery pack P (operation S2000).

Thereafter, when a state of the battery pack P being charged by the first control signal reaches a threshold of a specific reference (operation S3000), the battery exchange system may control the charger 1000 to stop its operation by using a second control signal from the controller (operation S4000). Here, the specific reference may be a state of charge (SoC) of the battery pack. In other words, when the charge amount (SoC) of the battery pack P being charged is 50% or more, the battery exchange system may stop the operation of the charger 1000 using the second control signal from the controller 7000.

Thereafter, the battery exchange system may control the discharger 3000 to operate using a third control signal from the controller 7000. Accordingly, the battery exchange system may discharge the battery pack P whose charging is stopped by the second control signal (operation S5000). Here, the discharger 3000 may discharge the battery pack P by outputting a pulse type signal waveform in which a change of the discharge current is clearly shown.

Thereafter, the battery exchange system may operate the measuring device 5000 using a fourth control signal from the controller 7000. Accordingly, the battery exchange system may measure at least one state information of the battery pack in a discharged state (operation S6000). Here, the at least one state information may include at least one of a voltage (V), a current (I), and a temperature (T), as described above.

Thereafter, the battery exchange system may store at least one measured state information in the battery condition diagnosing server S (operation S7000).

Meanwhile, the battery exchange system may operate the charger 1000 according to a first control signal from the controller 7000 to recharge the specific battery pack P whose charging has been stopped, until it is fully charged (operation S8000).

Furthermore, the battery exchange system may calculate impedance information of the battery pack P by using at least one piece of state information stored in the battery condition diagnosing server S (operation S9000).

The battery exchange system may calculate the state of health (SoH) of the battery pack P based on the impedance information of the battery pack P by using the battery condition diagnosing server S (operation S10000).

In more detail according to an embodiment, the battery exchange system may calculate a change in the internal resistance of the battery pack P according to the impedance change of the battery pack P. Then, the battery exchange system may calculate the state of health (SoH) of the battery pack P based on the calculated change in internal resistance. For example, when the internal resistance increases, the lifespan of the battery pack may be shortened, and thus the state of health (SoH) of the battery pack may be worse.

In addition, the battery exchange system may determine whether the battery pack is defective based on the impedance information of the battery pack P, using the battery condition diagnosing server S (operation S11000).

More specifically, according to an embodiment, the battery exchange system may use the battery condition diagnosing server S to compare the state of health (SoH) of the battery pack (P) calculated from the impedance change of the battery pack (P) with that of a reference battery pack under the same conditions.

Here when a difference of the SoH of the specific battery pack (P) and the reference SoH is more than a threshold value, the battery condition diagnosing server (S) may determine that a defect has occurred in the specific battery pack (P). Here, the defect may include a defect caused by a battery cell, an electric device or an appliance including the battery cell.

As described above, the embodiments of the present disclosure provide a battery swapping apparatus, an apparatus (server) for diagnosing a battery condition, a method for diagnosing a battery condition, and a battery exchange system including the battery swapping apparatus and the apparatus for diagnosing a battery condition with high-efficiency and high-reliability. The battery exchange system may discharge a battery pack in which charging has been stopped, measure at least one state information of the discharged battery pack, resume charging of the battery pack, calculate the impedance information from the at least one state information of the discharged battery pack, and determine a state of health (SoH) of the battery pack and whether the battery pack is defective.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the example embodiments of the present invention and their advantages have been described in detail, it should be understood that various changes, substitutions and alterations may be made herein without departing from the scope of the invention.

The invention claimed is:

1. A battery swapping apparatus comprising:
a charger configured to charge a battery pack accommodated within the battery swapping apparatus;
a discharger configured to discharge the battery pack;
a sensor configured to measure state information of the battery pack; and
a controller configured to, in response a state of charge of the battery pack reaching a predetermined reference value:
stop operation of the charger;
control the discharger to operate; and
acquire the state information of the battery pack in a discharged state; and upon acquisition of the state information of the battery pack in the discharged state, and prior to calculating an impedance of the battery pack from the acquired state information of the battery pack in the discharged state, control the charger to resume charging until the battery pack is fully charged.

2. The battery swapping apparatus of claim 1, wherein the controller is communicatively connected to an external server and the controller is configured to transmit the state information of the battery pack to the external server.

3. The battery swapping apparatus of claim 1, wherein the state information of the battery pack includes at least one of a voltage, a current or a temperature of the battery pack.

4. The battery swapping apparatus of claim 1, wherein the discharger is configured to discharge the battery pack by outputting a pulse type discharge current.

5. A battery exchange system comprising:
the battery swapping apparatus of claim 1; and
a server communicatively connected to the battery swapping apparatus,
wherein the controller of the battery swapping apparatus is configured to transmit the state information of the battery pack to the server, and wherein the server is configured to calculate an impedance of the battery pack based on the state information transmitted by the battery swapping apparatus.

6. The battery exchange system of claim 5, wherein the server is configured to determine whether the battery pack is defective based the calculated impedance of the battery pack.

7. An apparatus for diagnosing a condition of a battery pack, comprising:
at least one processor; and
a memory having stored thereon at least one instruction executed by the at least one processor,
wherein the at least one instruction causes the at least one processor to:
receive and store state information of the battery pack, wherein the state information of the battery pack is collected from the battery upon the battery reaching a discharged state;
calculate impedance information based on the received state information of the battery pack; and
calculate a state of health (SoH) of the battery pack from the impedance information.

8. The apparatus of claim 7, wherein the state information of the battery pack is indicative of a condition of the battery pack upon being charged to a predetermined reference value and subsequently discharged.

9. The apparatus of claim 7, wherein the state information of the battery pack includes at least one of a voltage, a current or a temperature of the battery pack.

10. The apparatus of claim 7, wherein the at least one instruction causes the at least one processor to:
calculate a change in internal resistance of the battery pack from the state information of the battery pack; and
calculate the SoH of the battery pack based further on the calculated change in internal resistance of the battery pack.

11. The apparatus of claim 7, wherein the at least one instruction causes the at least one processor to determine whether to diagnose a defect of the battery pack based on the SoH of the battery pack.

12. The apparatus of claim 11, wherein the at least one instruction causes the at least one processor to:
compare the SoH of the battery pack with a reference SoH; and
determine presence of a defect in the battery pack in response to a difference between the SoH of the battery pack and the reference SoH exceeding a threshold value.

13. A method for diagnosing a condition of a battery pack comprising:
receiving and storing, by at least one processor, state information of the battery pack, wherein the state information of the battery pack is collected from the battery upon the battery reaching a discharged state;
calculating, by the at least one processor, impedance information based on the state information of the battery pack; and
calculating, by the at least one processor, a state of health (SoH) of the battery pack from the impedance information.

14. The method of claim 13, wherein the state information of the battery pack is indicative of a condition of the battery pack upon being charged to a predetermined reference value and subsequently discharged.

15. The method of claim 13, wherein the state information of the battery pack includes at least one of a voltage, a current or a temperature of the battery pack.

16. The method of claim 13, wherein calculating the SoH of the battery pack includes:
calculating a change in internal resistance of the battery pack from the state information of the battery pack; and
calculating the SoH of the battery pack based on the calculated change in the internal resistance of the battery pack.

17. The method of claim 13, further comprising:
determining, by the at least one processor, whether to diagnose a defect of the battery pack based on the SoH of the battery pack.

18. The method of claim 17, wherein determining whether to diagnose a defect of the battery pack includes:
comparing the SoH of the battery pack with a reference SoH; and
determining presence of a defect in the battery pack in response to a difference between the SoH of the battery pack and the reference SoH exceeding a threshold value.

* * * * *